United States Patent
Moschiano et al.

(10) Patent No.: US 11,688,474 B2
(45) Date of Patent: Jun. 27, 2023

(54) DUAL VERIFY FOR QUICK CHARGE LOSS REDUCTION IN MEMORY CELLS

(71) Applicant: Micron Technology, Inc., Boise, ID (US)

(72) Inventors: Violante Moschiano, Avezzano (IT); Yingda Dong, Los Altos, CA (US)

(73) Assignee: Micron Technology, Inc., Boise, ID (US)

(*) Notice: Subject to any disclaimer, the term of this patent is extended or adjusted under 35 U.S.C. 154(b) by 89 days.

(21) Appl. No.: 17/234,502

(22) Filed: Apr. 19, 2021

(65) Prior Publication Data

US 2022/0336028 A1 Oct. 20, 2022

(51) Int. Cl.
| | |
|---|---|
| G11C 16/34 | (2006.01) |
| G11C 16/10 | (2006.01) |
| G11C 16/26 | (2006.01) |
| G11C 7/10 | (2006.01) |
| G11C 16/04 | (2006.01) |
| G11C 16/24 | (2006.01) |
| G11C 7/06 | (2006.01) |
| G11C 16/30 | (2006.01) |

(52) U.S. Cl.
CPC .......... *G11C 16/3459* (2013.01); *G11C 7/065* (2013.01); *G11C 7/1048* (2013.01); *G11C 16/0433* (2013.01); *G11C 16/102* (2013.01); *G11C 16/24* (2013.01); *G11C 16/26* (2013.01); *G11C 16/30* (2013.01); *G11C 16/3409* (2013.01)

(58) Field of Classification Search
None
See application file for complete search history.

(56) References Cited

U.S. PATENT DOCUMENTS

| | | | | |
|---|---|---|---|---|
| 6,002,614 | A * | 12/1999 | Banks | G11C 11/5642 365/189.14 |
| 7,206,231 | B2 * | 4/2007 | Wan | G11C 16/10 365/185.28 |
| 8,526,239 | B2 * | 9/2013 | Kim | G11C 16/26 365/185.21 |
| 9,343,156 | B1 * | 5/2016 | Mui | G11C 29/50012 |
| 2005/0083735 | A1 * | 4/2005 | Chen | G11C 11/5628 365/185.17 |
| 2006/0291291 | A1 * | 12/2006 | Hosono | G11C 16/3459 365/185.22 |
| 2008/0239806 | A1 * | 10/2008 | Moschiano | G11C 11/5628 365/185.23 |

(Continued)

*Primary Examiner* — J. H. Hur
(74) *Attorney, Agent, or Firm* — Lowenstein Sandler LLP

(57) ABSTRACT

A memory device includes a memory array of memory cells. A page buffer is to apply, to a bit line, a first voltage or a second voltage that is higher than the first voltage during a program verify operation. Control logic operatively coupled with the page buffer is to perform operations including: causing a plurality of memory cells to be programmed with a first program pulse; measuring a threshold voltage for the memory cells; forming a threshold voltage distribution from the measured threshold voltages; classifying, based on the threshold voltage distribution, a first subset of the memory cells as having a faster quick charge loss than that of a second subset of the memory cells; and causing, in response to the classifying, the page buffer to apply the second voltage to the bit line during a program verify operation performed on any of the first subset of memory cells.

19 Claims, 16 Drawing Sheets

(56) References Cited

U.S. PATENT DOCUMENTS

| | | | |
|---|---|---|---|
| 2009/0219761 A1* | 9/2009 | Moschiano | G11C 16/3454 365/185.18 |
| 2012/0020155 A1* | 1/2012 | Kim | G11C 11/5628 365/185.03 |
| 2012/0026797 A1* | 2/2012 | Kim | G11C 16/24 365/185.18 |
| 2014/0241058 A1* | 8/2014 | Yoshida | G11C 16/3427 365/185.03 |
| 2016/0086673 A1* | 3/2016 | Yamada | G11C 16/26 327/309 |
| 2016/0118126 A1* | 4/2016 | Moon | G11C 16/12 711/103 |

* cited by examiner

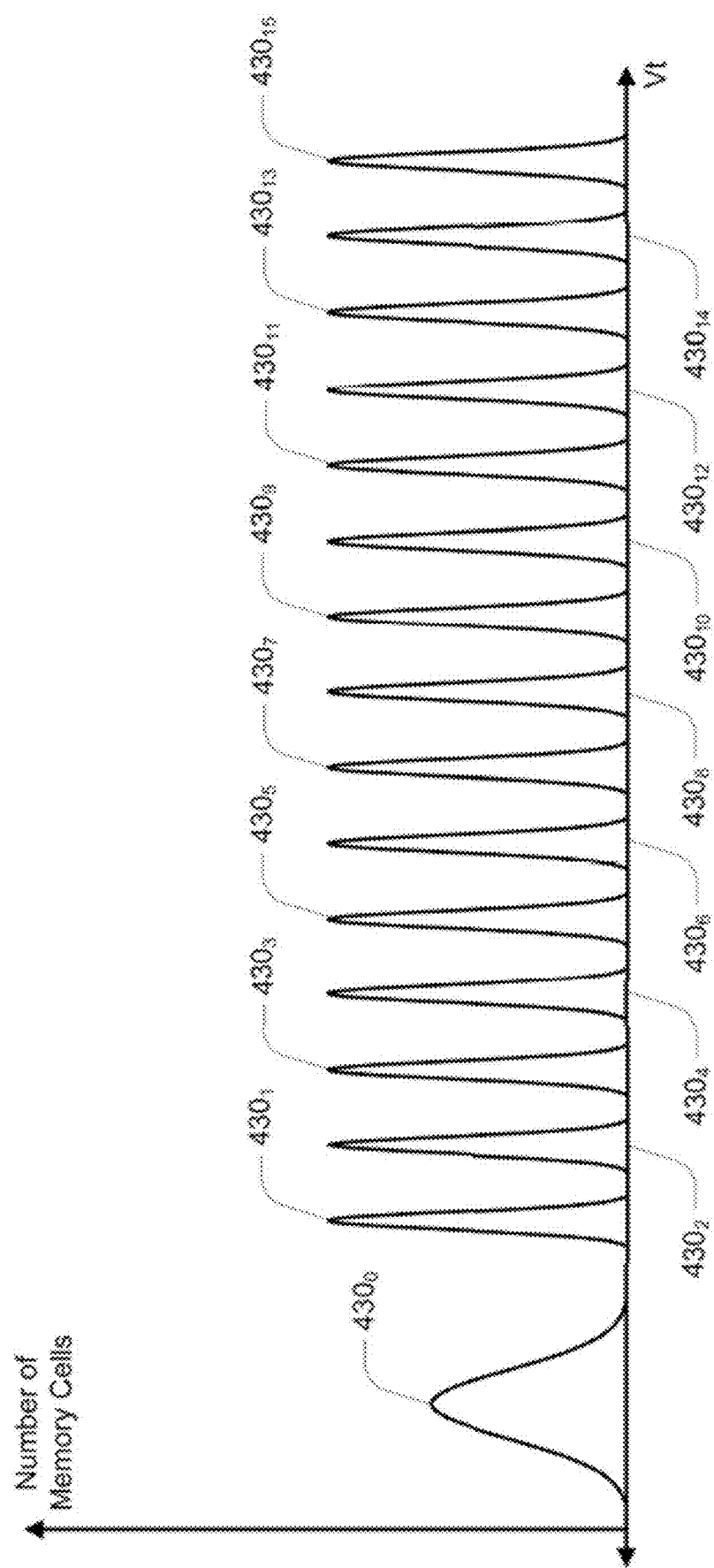

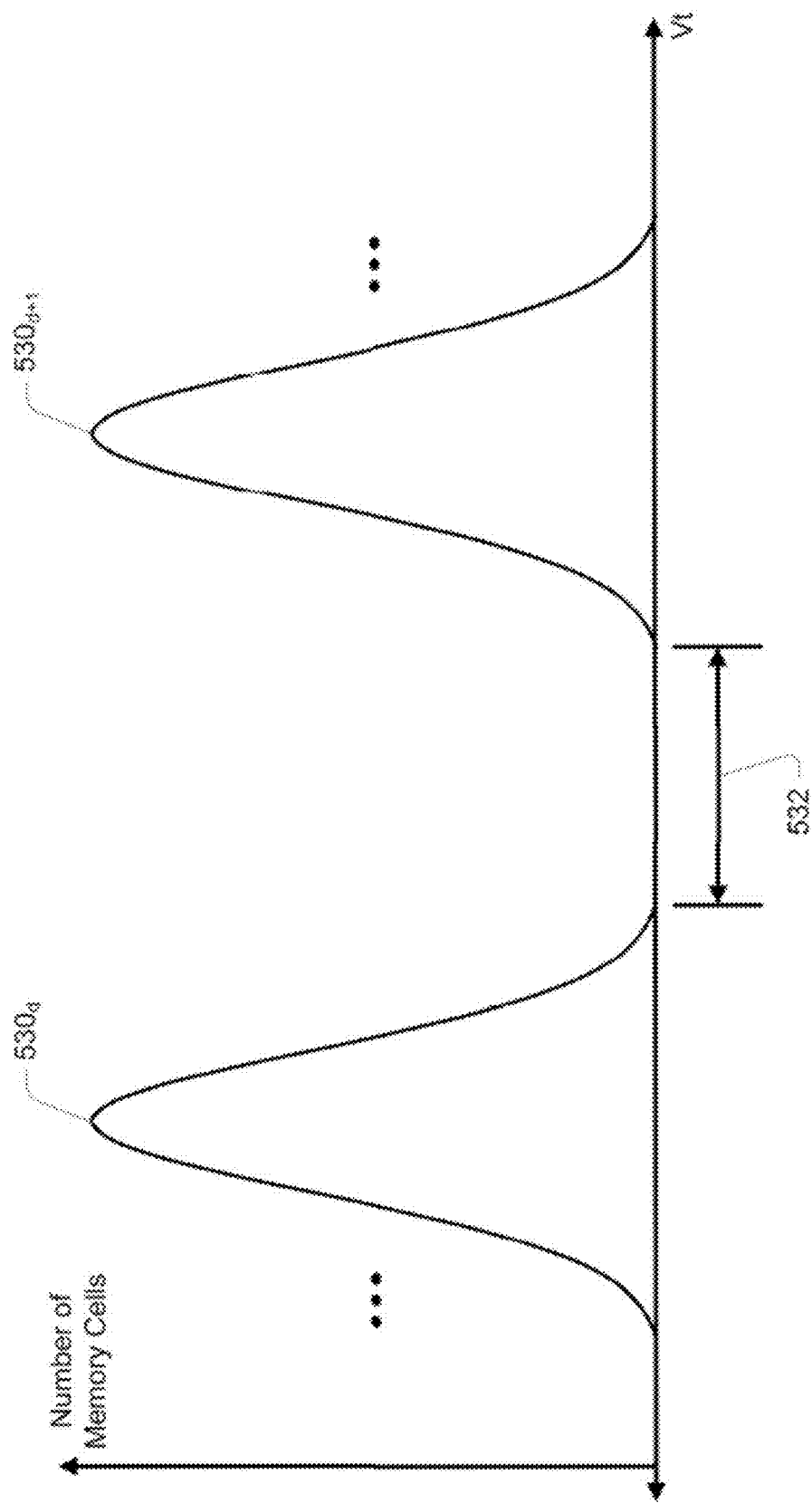

DUAL VERIFY FOR QUICK CHARGE LOSS REDUCTION IN MEMORY CELLS

TECHNICAL FIELD

Embodiments of the disclosure are generally related to memory sub-systems, and more specifically, relate to a dual verify for quick charge loss reduction in memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 4 is a conceptual depiction of threshold voltage distributions of multiple memory cells of a memory array according to an embodiment FIGS. 5A-5B are conceptual depictions of threshold voltage distributions of multiple memory cells at different stages following programming for use with various embodiments.

DETAILED DESCRIPTION

Figure 1A:
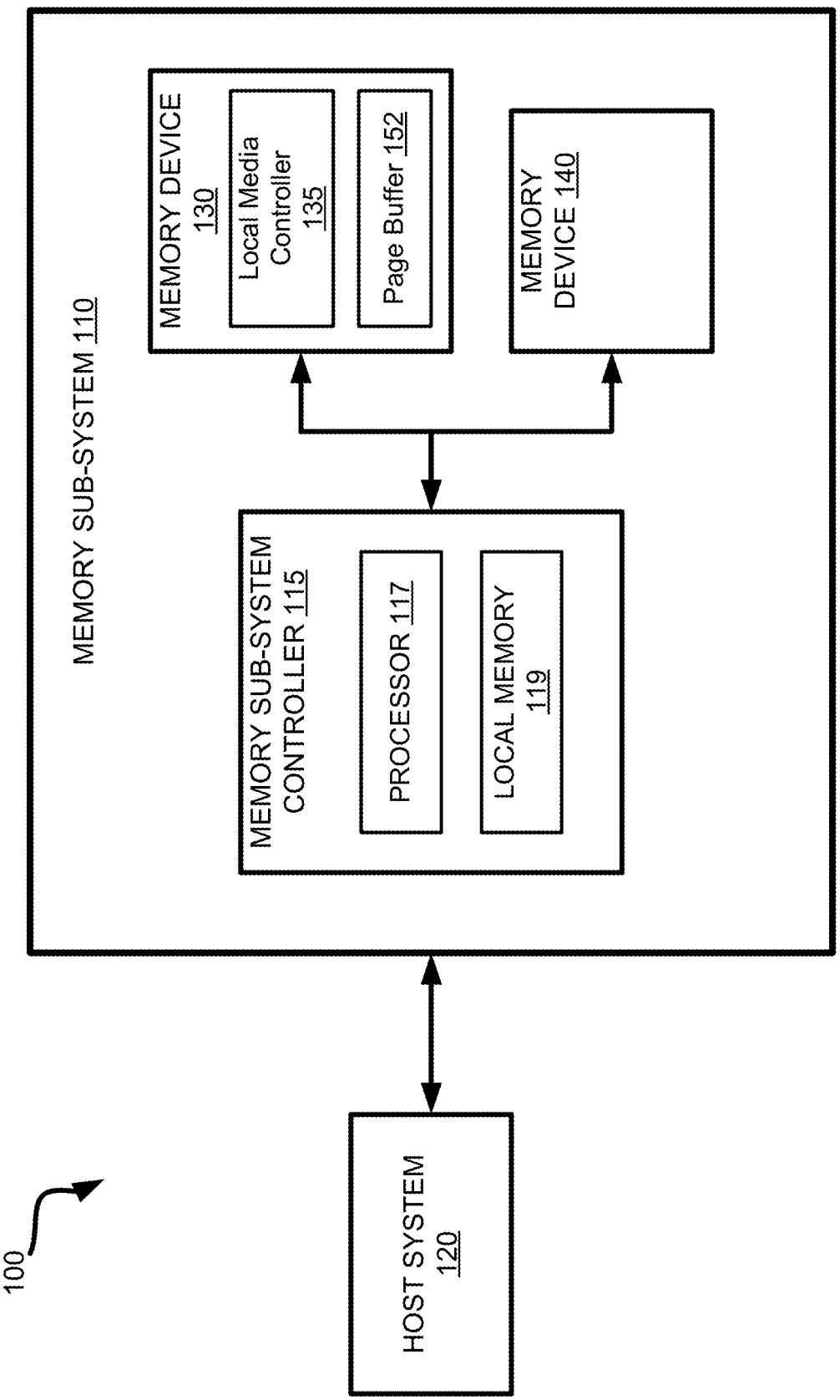
FIG. 1A illustrates an example computing system that includes a memory sub-system in accordance with some embodiments.

Embodiments of the present disclosure are directed to a dual verify for quick charge loss reduction in memory cells. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1A. A non-volatile memory device is a package of one or more dice. Each die can include one or more planes. Planes can be grouped into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

A memory device can be made up of bits arranged in a two-dimensional or three-dimensional grid, also referred to as a memory array. Memory cells are fabricated onto a silicon wafer in an array of columns (also hereinafter referred to as bit lines) and rows (also hereinafter referred to as wordlines). A wordline can refer to one or more rows of memory cells of a memory device that are used with one or more bit lines to generate the address of each of the memory cells. The intersection of a bit line and wordline constitutes the address of the memory cell.

Various access operations can be performed on the memory cells. For example, data can be written to, read from, and erased from memory cells. Memory cells can be grouped into a write unit, such as a page. For some types of memory devices, a page is the smallest write unit. A wordline can have multiple pages on the same wordline grouped as sub-blocks. One sub-block is typically accessed at any given time. Although each sub-block has its own set of select gates coupled to bit lines, the sub-blocks share a common page buffer or sense-amplifier.

In certain memory systems, charge loss occurs within memory cells in which a threshold voltage (Vt) of a memory cell can shift away from an originally-programmed level, making it more difficult to determine a logical state of the memory cell. Quick charge loss (QCL) is the quantity of charge loss, measurable in threshold voltage, that is lost from a memory cell soon after having been programmed, e.g., within a second or seconds. Some memory cells have more traps within polysilicon channel grain boundaries. These traps tend to either trap electrons or release electrons, depending on pre-programmed states of the traps. Memory cells that trap more electrons make cell Vt appear higher, leading to faster program speed, e.g., a lower program time ("tprog"). Memory cells that release more electrons make cell Vt appear lower, causing a slower program speed, e.g., a higher tprog. Thus, although two memory cells are programmed about the same time, the memory cells can experience different amounts of QCL. Further, cells with faster QCL exhibit larger shifts in threshold voltage distributions compared to cells with slower QCL. Ideally, QCL would be the same in all memory cells so that shifts in threshold voltage distributions are predictable, but the structural reality of trapping and releasing electrons, to the extent such is not preventable, has to be compensated for in some way. Additionally, due to technology scaling where cell volume size is being reduced, every additional electron trapped or released will have a larger impact to QCL in advanced memory devices.

In these memory systems, increase in charge loss (whether fast or slow charge loss) also tends to reduce read window budget (RWB) between adjacent threshold voltage distributions of logical states. As various RWBs are reduced, the memory device can exhibit higher bit error rates when reading out discrete logical states from the memory cells, e.g., it is more difficult to detect local minima between the adjacent threshold voltage distributions. In certain memory systems, compensation for different QCL rates and corresponding reduction in RWB is provided by making program steps smaller when iteratively programming each memory cell using a programming method referred to as incremental step programming path (ISPP). This ISPP programming employs several sequential program pulses, with intervening program verify operations, in which programming is locked after exceeding a program verify (PV) voltage. While making ISPP-based programming steps more frequent may compensate for reduced RWBs, the use of additional programming steps also degrades performance in increasing program time.

Aspects of the present disclosure address the above and other deficiencies through modifying a page buffer that enables programming (e.g., writing to) the memory cells and reading data for the memory cells. The modification to the page buffer can enable applying two different program verify voltages to a bit line (coupled to the memory cells) during a program verify operation on two different subsets of memory cells, e.g., a first voltage and a second voltage that is higher than the first voltage. More specifically, the page buffer can apply the first voltage to the bit line during a program verify operation performed on a first subset of the memory cells classified to have a slow QCL and apply the second voltage to a second subset of the memory cells during a program verify operation performed on a second subset of the memory cells classified to have a fast QCL. The second subset of the memory cells can thus be classified as being "fast" compared to the programming speed of the first memory cell. Using two different PV voltage levels can enable normalization of the threshold voltage distributions between two different subsets of memory cells that differ in QCL rate. In this way, if properly compensated and once programmed, each of the second subset of the memory cells will exhibit faster QCL and be left with a substantially identical threshold voltage distribution as each of the first subset of the memory cells with the slower QCL. Note that the term "slower" for QCL may be considered a normal QCL rate, but certainly slower than the "fast" QCL rate.

In these embodiments, control logic of a local media controller can direct the disclosed process by causing the memory cells (e.g., of a memory array) to be programmed with a first program pulse. The control logic can further cause a threshold voltage to be read for each of the memory cells and form a threshold voltage distribution from the measured threshold voltages. The control logic can then classify, based on the threshold voltage distribution, a first subset of the plurality of memory cells as having a faster quick charge loss than that of a second subset of the plurality of memory cells. The control logic can cause, in response to the classifying, the page buffer to apply the second voltage to the bit line during a program verify operation performed on any of the first subset of the memory cells. In this way, the control logic can classify the second subset of memory cells as slow QCL cells and the first subset of memory cells as fast QCL cells for purposes of applying the first PV voltage level and the second PV voltage level, respectively, when performing a program verify operation. Later read operations of the first and second subsets of memory cells can be performed without splitting read (or sensing) voltage levels.

Therefore, advantages of the systems and methods implemented in accordance with some embodiments of the present disclosure include, but are not limited to, an efficient and effective way to compensate for different quick charge losses between memory cells programmed at about the same point in time. Such compensation is performed with lower overall program time (tprog) compared to other ISPP-related solutions with similar (or increased) reduction in overall bit error rates as a result of the compensation. Other advantages will be apparent to those skilled in the art of QCL-compensation-based hardware design and associated algorithms within a memory sub-system discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes a page buffer 152, which can provide the circuitry used to program data to the memory cells of the memory device 130 and read the data out of the memory cells. The page buffer 152 can be designed to apply two different program verify voltages to a bit line used to perform a program verify operation on slow QCL cells using a first voltage and on fast QCL cells using a second voltage, respectively, where the second voltage is higher than the first voltage.

In these embodiments, control logic of the local media controller 135 can be adapted to measure the threshold voltage distributions read (or otherwise accessed) within different sets of memory cells in order to then classify these memory cells as either slow QCL cells or fast QCL cells. For example, the control logic can cause a number of memory cells of a memory array to be programmed with a first program pulse. The control logic can measure a threshold voltage for these memory cells and form a threshold voltage distribution from the measured threshold voltages. The control logic can then classify, based on the threshold voltage distribution, a first subset of the memory cells as having a faster quick charge loss (QCL) than that of a second subset of the memory cells. The control logic can ultimately cause, in response to the classifications, the page buffer to apply the second voltage to the bit line during a program verify operation performed on any of the first subset of memory cells and apply the first voltage to the bit line during a program verify operation performed on any of the second subset of the memory cells.

Figure 1B:
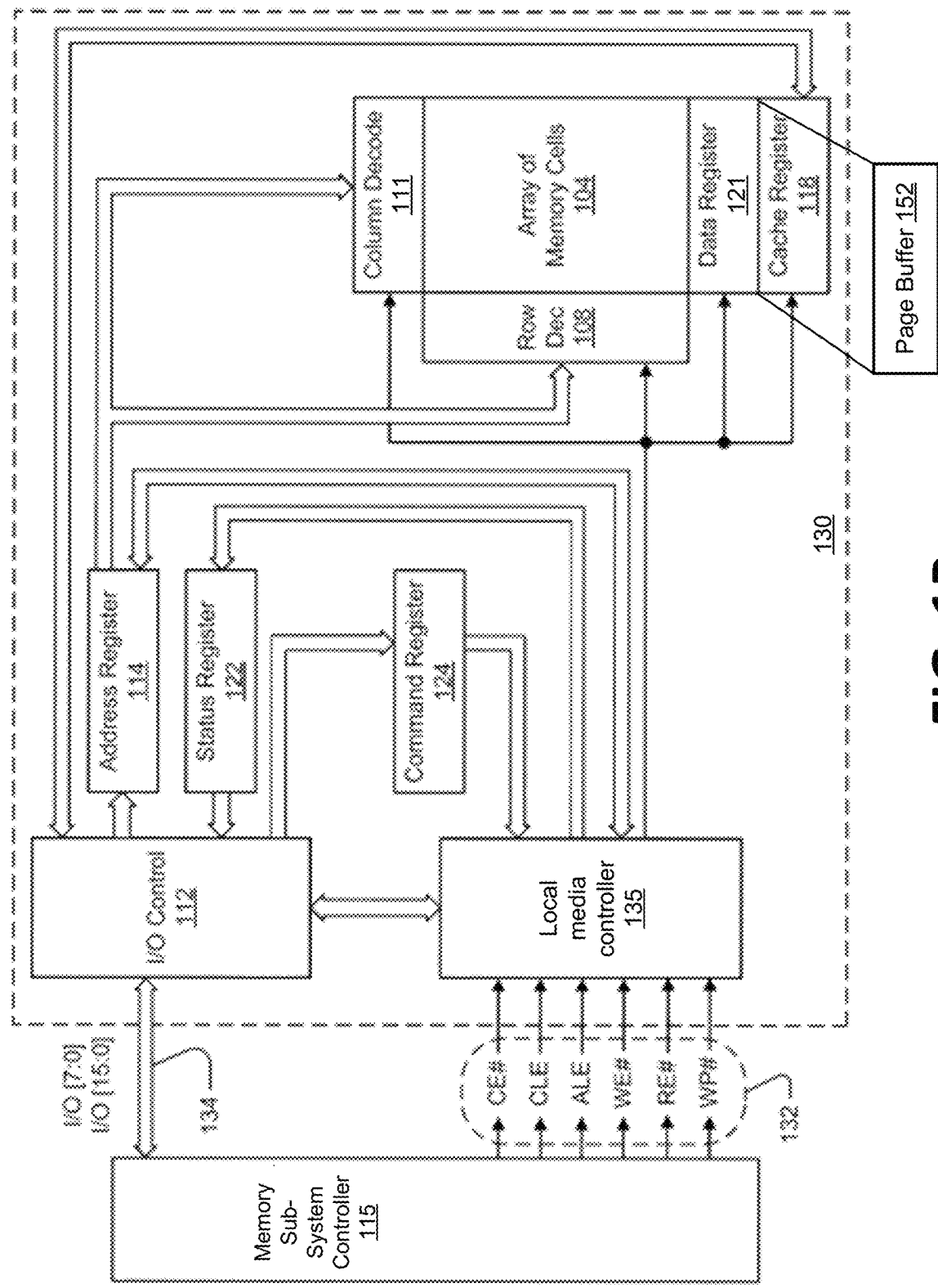
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
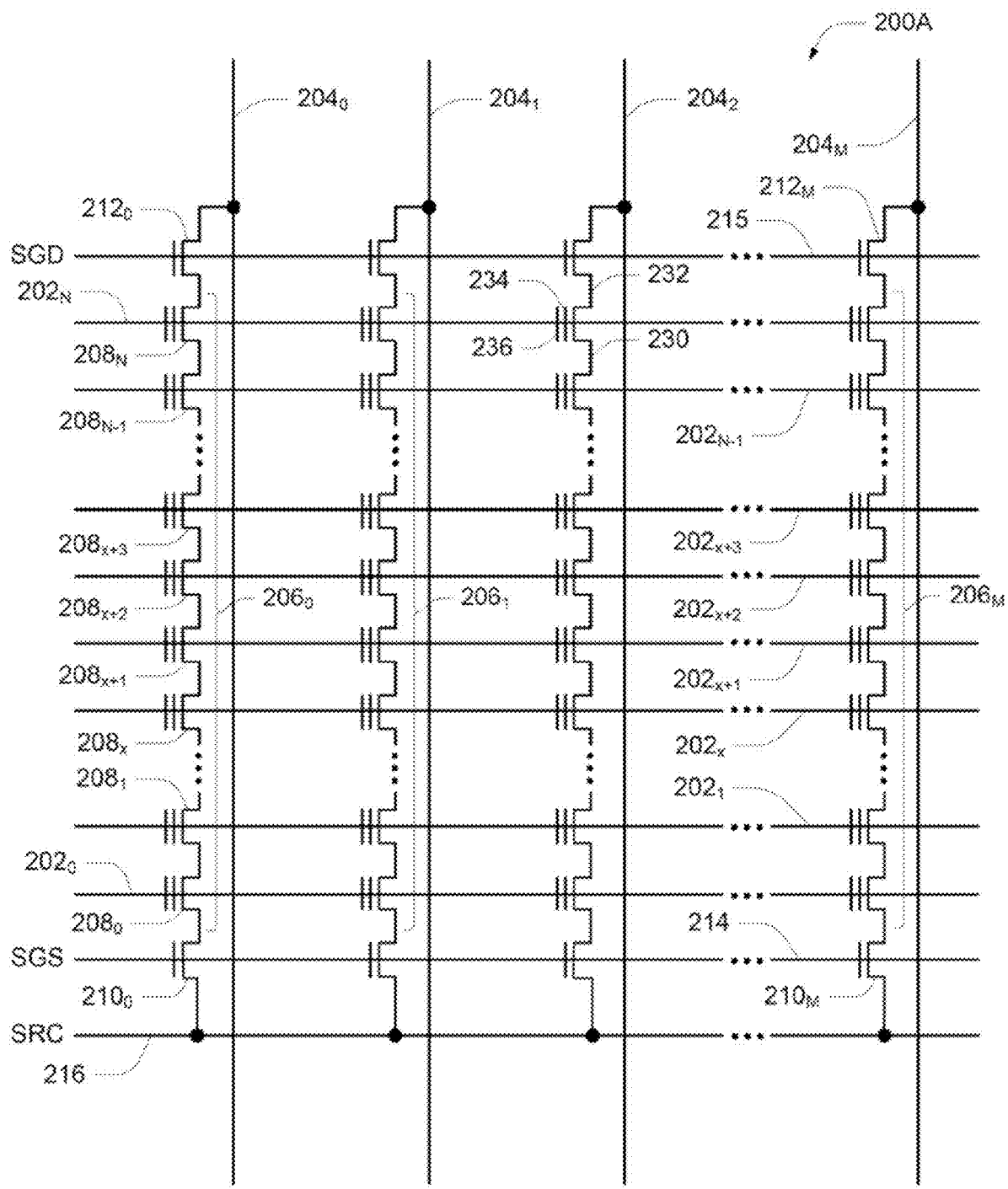
FIG. 2A-2C are schematics of portions of an array of memory cells as could be used in a memory of the type described with reference to FIG. 1B according to an embodiment.
Figure 2B:
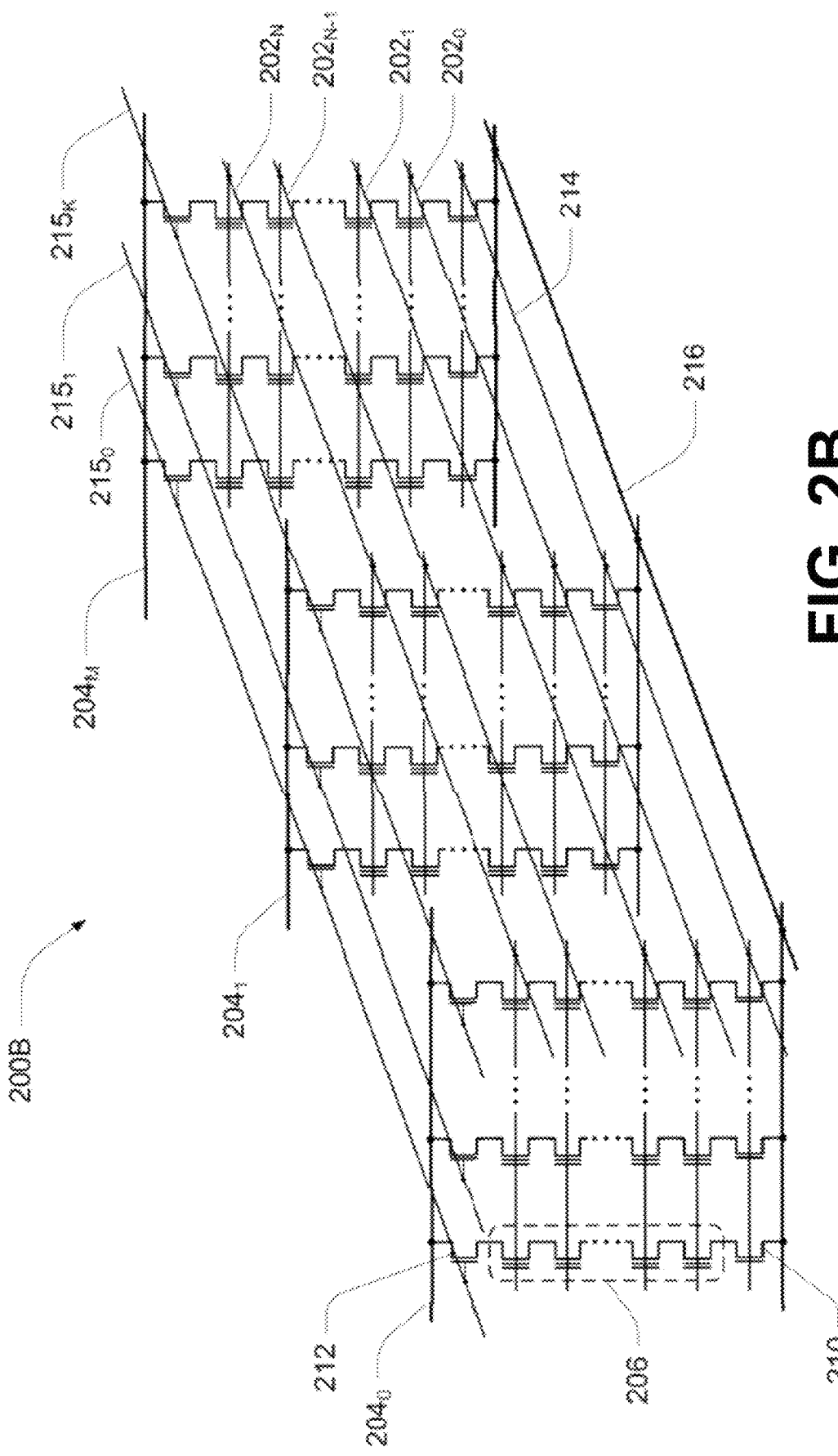
Figure 2C:
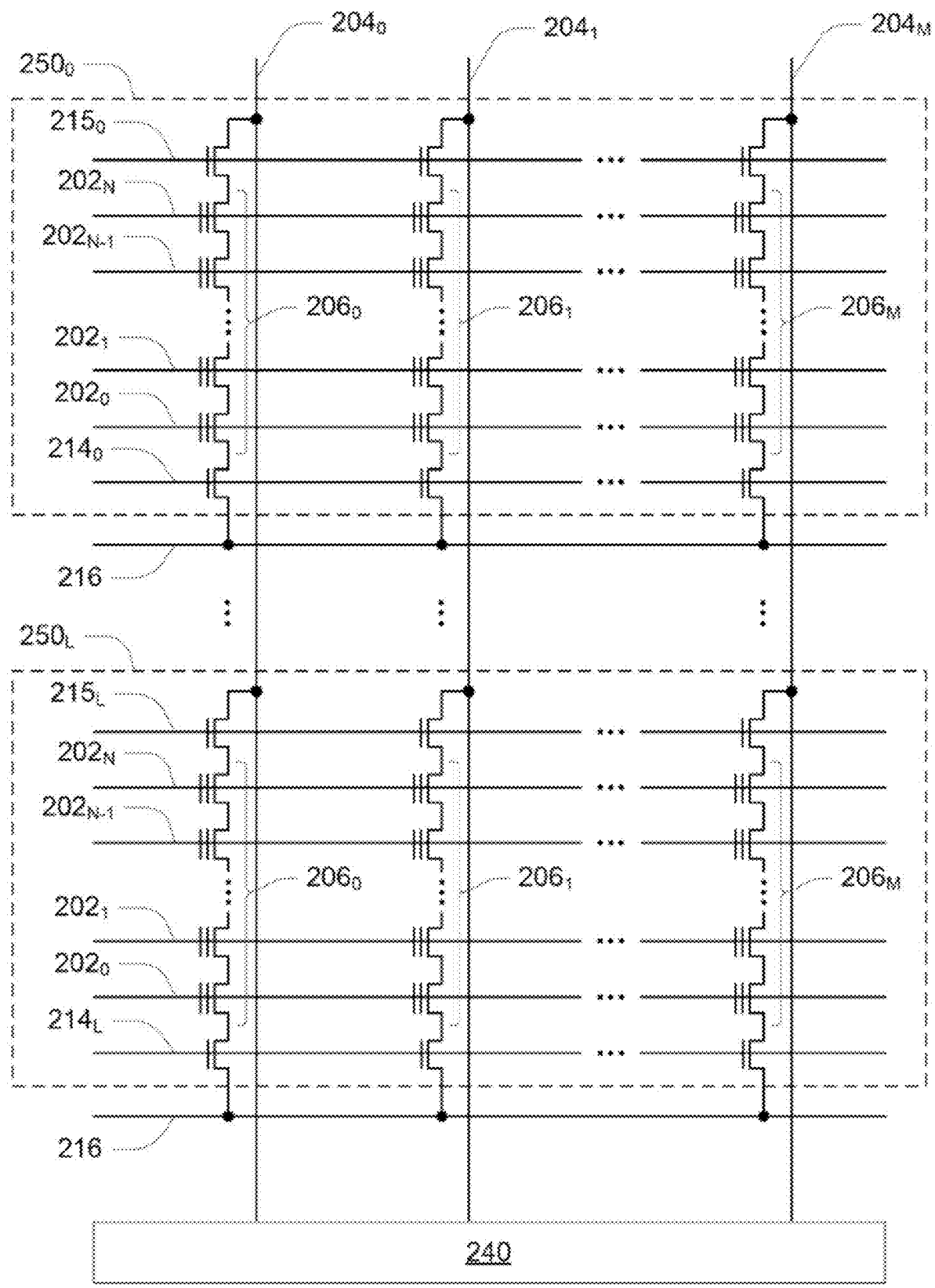

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bit lines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bit lines 204.

Figure 3:
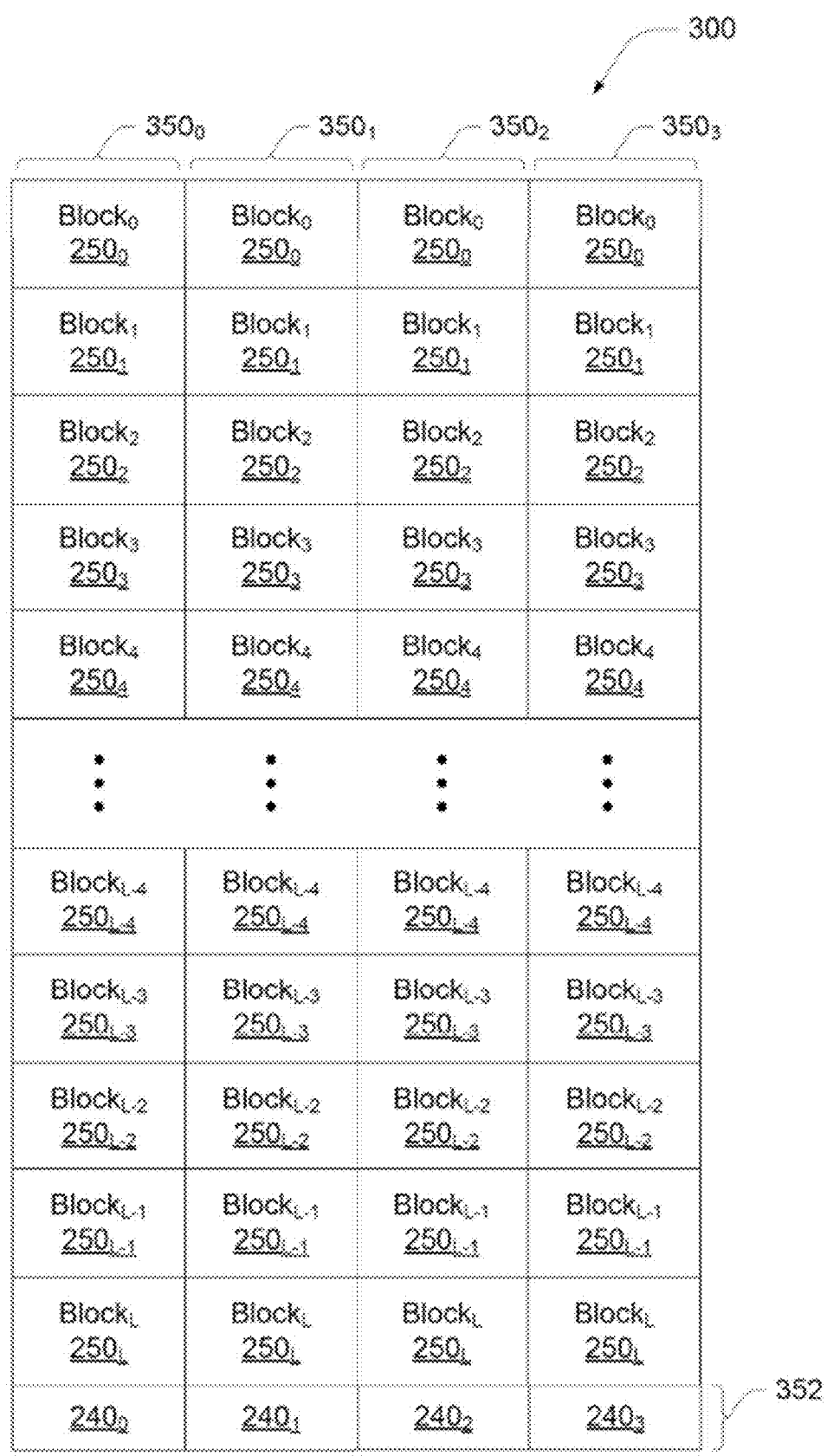
FIG. 3 is a block schematic of a portion of an array of memory cells as could be used in a memory of the type described with reference to FIG. 1B according to an embodiment.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

FIG. 4 is a conceptual depiction of threshold voltage ranges of multiple memory cells. FIG. 4 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ can tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$, and $430_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case can be storing a data state L0 having a data value of logical '1111' and is typically referred to as the erased state of the memory cell. If the threshold voltage is within the second of the sixteen threshold voltage ranges $430_1$, the memory cell in this case can be storing a data state L1 having a data value of logical '0111'. If the threshold voltage is within the third of the sixteen threshold voltage ranges $430_2$, the memory cell in this case can be storing a data state L2 having a data value of logical '0011', and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 5B:
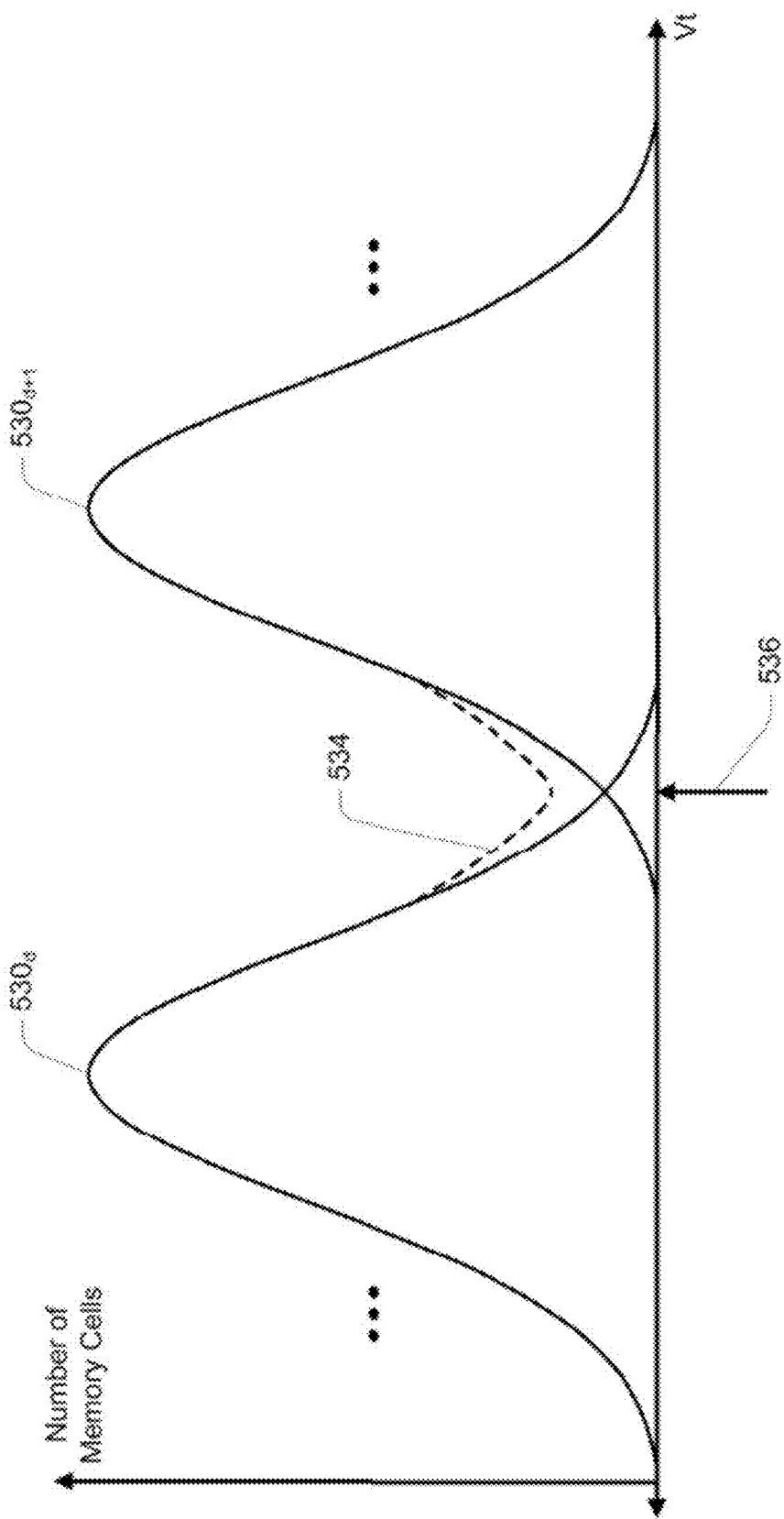

FIGS. 5A-5B are conceptual depictions of threshold voltage distributions of multiple memory cells at different stages following programming for use with embodiments. Following programming, threshold voltages of memory cells can shift due to such phenomena as quick charge loss (QCL). QCL is a de-trapping of electrons near a gate dielectric interface out to the channel region of the memory cell, and can cause a Vt shift shortly after a program pulse. When a memory cell passes the verify operation, the programmed threshold voltage can appear to be higher due to the trapped charge in the gate dielectric. When the memory cell is read after the program operation has been completed, the memory cell can have a Vt that is lower than the Vt obtained during the program verify operation due to the charge in the gate dielectric leaking out to the channel region. Threshold voltages of memory cells can further shift due to cumulative charge loss over the age of their programmed data, e.g., a period of time between programming the data and reading the data, referred to herein as data age. Charge loss can also be affected by memory cell age. Memory cell age, as opposed to data age, is often indicated in terms of a number of program/erase cycles the memory cells have experienced. These various phenomena can result in a widening and shifting of the threshold voltage distributions over time. Various embodiments provide apparatus and methods that can facilitate a mitigation of these concerns.

FIG. 5A is a conceptual depiction of threshold voltage distributions of multiple memory cells following (e.g., immediately following) a programming operation, while FIG. 5B is a conceptual depictions of those same threshold voltage distributions at some later time following that programming operation. The threshold voltage distributions $530_d$-$530_{d+1}$ of FIG. 5A and FIG. 5B can represent some portion of the distributions for threshold voltage ranges $430_0$-$430_{15}$ of FIG. 4 at the completion of a programming operation for memory cells.

With reference to FIG. 5A, adjacent threshold voltage distributions 530 are typically separated by some margin 532 (e.g., dead space) at the completion of programming. Applying a sense voltage (e.g., read voltage) within the margin 532 to the control gates of the plurality of memory cells can be used to distinguish between the memory cells of the threshold voltage distribution $530_d$ (and any lower threshold voltage distribution) and the memory cells of the threshold voltage distribution $530_{d+1}$ (and any higher threshold voltage distribution), conceivably without error.

With reference to FIG. 5B, adjacent threshold voltage distributions can have widened, such that the threshold voltage distribution $530_d$ and the threshold voltage distribution $530_{d+1}$ can merge as represented by the curve 534 indicating a sum of the two adjacent threshold voltage distributions. The curve 534 can have a local minima 536. Where such merging of adjacent threshold voltage distributions occurs, distinguishing between memory cells intended to be in the threshold voltage distribution $530_d$ and memory cells intended to be in the threshold voltage distribution $530_{d+1}$ will generally result in some error. For example, applying a sense voltage, having a voltage level corresponding to the local minima 536, to the control gates of the plurality of memory cells can be expected to produce the least number of memory cells having a data state other than their target (e.g., intended) data state, but a certain number of errors would generally be inevitable. Applying a sense voltage higher or lower than the voltage level corresponding to the local minima 536 can be expected to produce larger numbers of errors. While applying a sense voltage having the voltage level corresponding to the local minima 536 of the curve 534 can produce the least number of errors, it can be difficult to determine at what voltage level this local minima 536 occurs.

Figure 6:
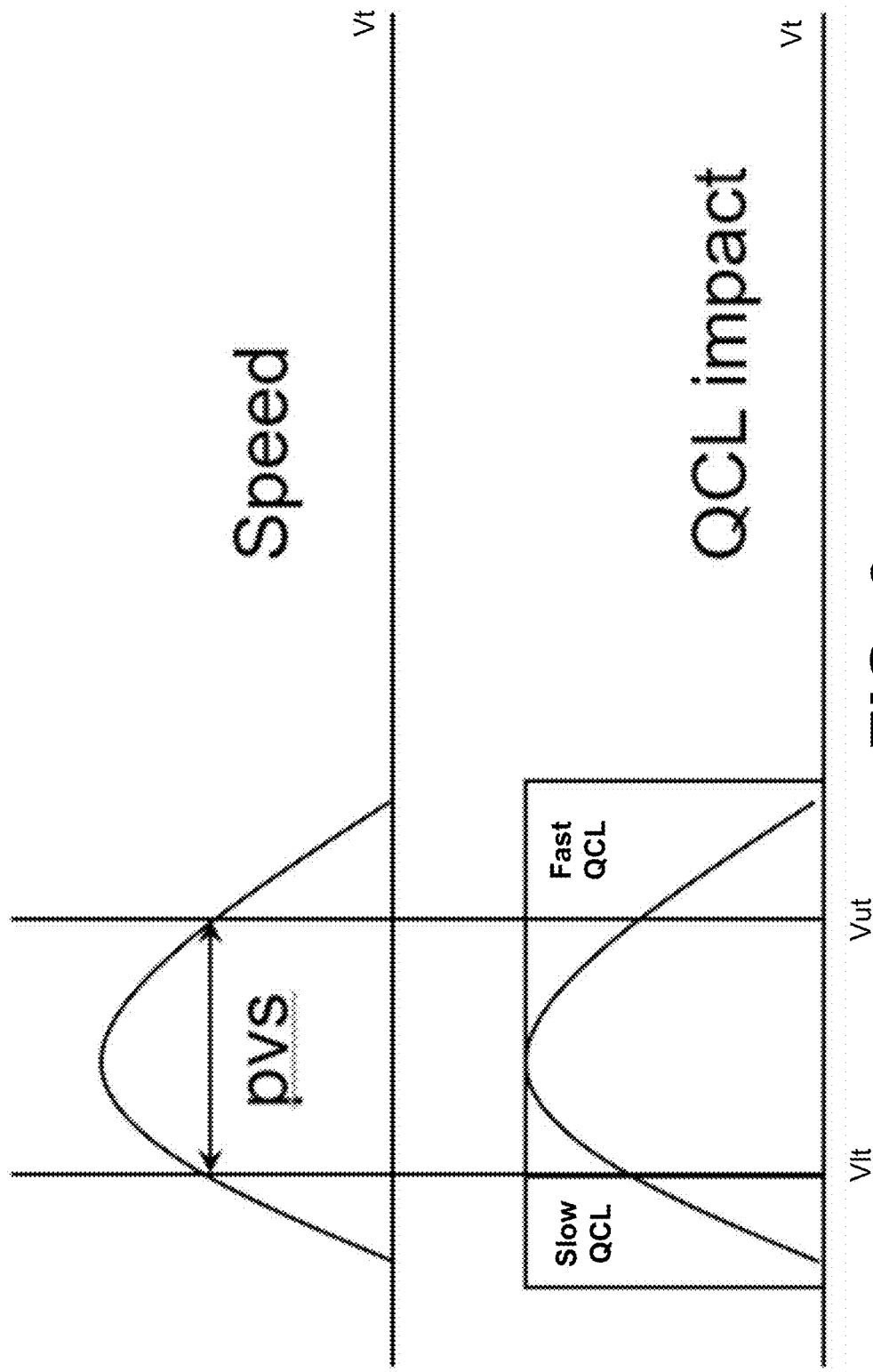
FIG. 6 is a set of graphs illustrating the impact that the speed of quick charge loss has on a threshold voltage distribution of a set of memory cells after the memory cells have been programmed, according to an embodiment.

FIG. 6 is a set of graphs illustrating the impact that the speed of quick charge loss has on a threshold voltage distribution of a set of memory cells after the memory cells have been programmed, according to an embodiment. As illustrated, the width of any given threshold voltage (Vt)

distribution is referred to as program Vt sigma (PVS). When programming memory cells, e.g., via ISPP, the threshold voltage distribution can shift due to QCL soon after programming.

After reading out or measuring the threshold voltages of the set of memory cells directly after programming, the resulting threshold voltage distribution can be plotted as in FIG. 6. In some embodiments, control logic can cause the threshold voltage distribution to be measured, e.g., by measuring an upper tail of the threshold voltage distribution above an upper threshold voltage value (Vut) and optionally also by measuring a lower tail of the threshold voltage distribution below a lower threshold voltage value (Vlt). The values for the Vut and Vlt can be programmed to the control logic, e.g., within the local media controller 135.

In various embodiments, the control logic can identify the first subset of the memory cells as memory cells having a threshold voltage above the upper threshold voltage value and identify the second subset of the memory cells as memory cells having a threshold voltage below or equal to the upper threshold voltage value. In this way, any memory cells having a voltage threshold that is above the upper threshold voltage value (Vut) can be classified as fast QCL and any memory cells having a voltage threshold that is below or equal to the upper threshold voltage value (Vut) can be classified as slow QCL. In this sense, "slow" QCL should be understood as not being fast enough to be considered "fast" QCL. In some embodiments, any memory cells having a threshold voltage that falls below the lower threshold voltage value (Vlt) can be considered as the slowest QCL, thus generating a third subset of separately classified memory cells in further embodiments that will be discussed.

In these embodiments, a first voltage can be applied to a bit line for performing program verify (PV) of the slow QCL memory cells and a second voltage, which is higher than the first voltage, can be applied to the bit line for performing PV of the fast QCL memory cells. In a further embodiment, a third voltage could be employed to perform program verify on the "slowest" cells as an extension to the present embodiments, e.g., in lieu of the first voltage.

Figure 7A:
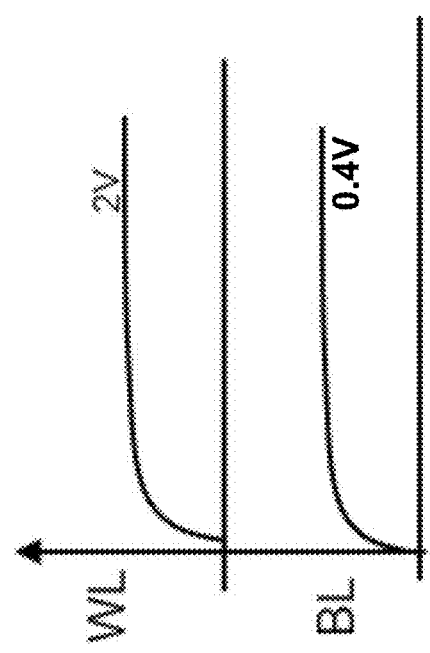
FIG. 7A is a graph illustrating a single bit line voltage value and a wordline voltage value used for performing a program verify operation on memory cells of a memory array according to an embodiment.

FIG. 7A is a graph illustrating a single bit line voltage value and a wordline voltage value used for performing a program verify (PV) operation on memory cells of a memory array according to an embodiment. Because the bit line voltage remains unchanged, the program verify operation is performed on all memory cells at the same PV voltage level, e.g., 0.4V, without the ability to compensate (ahead of time) for QCL. The PV voltage of 0.4V is merely exemplary for purposes of explanation herein, and can vary for different designs.

Figure 7B:
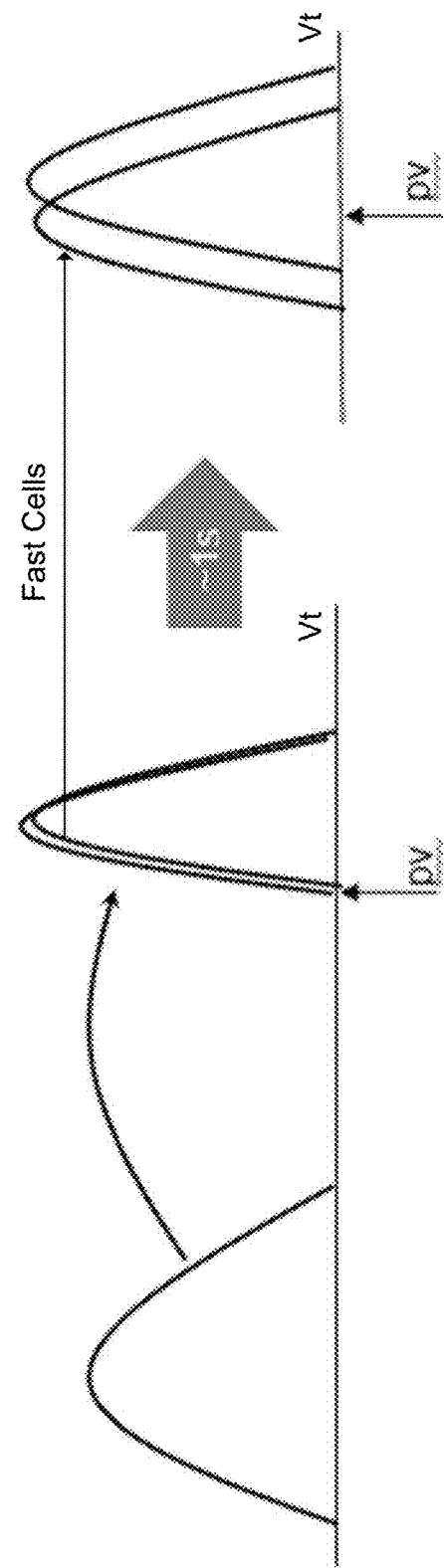
FIG. 7B is a graph of a threshold voltage distribution of two subsets of memory cells that are programmed about the same time and a shift in corresponding program verify voltage values about a second later according to an exemplary embodiment.

FIG. 7B is a graph of a threshold voltage distribution of two subsets of memory cells that are programmed about the same time and a shift in corresponding program verify voltage values about a second later according to an exemplary embodiment. The program verify operation of the two subsets of memory cells is performed at the same bit line voltage, as per FIG. 7A, and thus at an identical PV voltage level. Because of this, the threshold voltage distributions start at approximately the same Vt range, e.g., above the PV voltage level. Due to one of the subsets of the memory cells having a faster QCL than the other subset of memory cells, after about a second (or seconds), the threshold voltage distribution of the fast QCL cells has dropped in Vt faster than that of the slow QCL cell. Accordingly, FIGS. 7A-7B together illustrate a need for compensation in QCL through applying two different PV voltage levels on the bit line.

Figure 8:
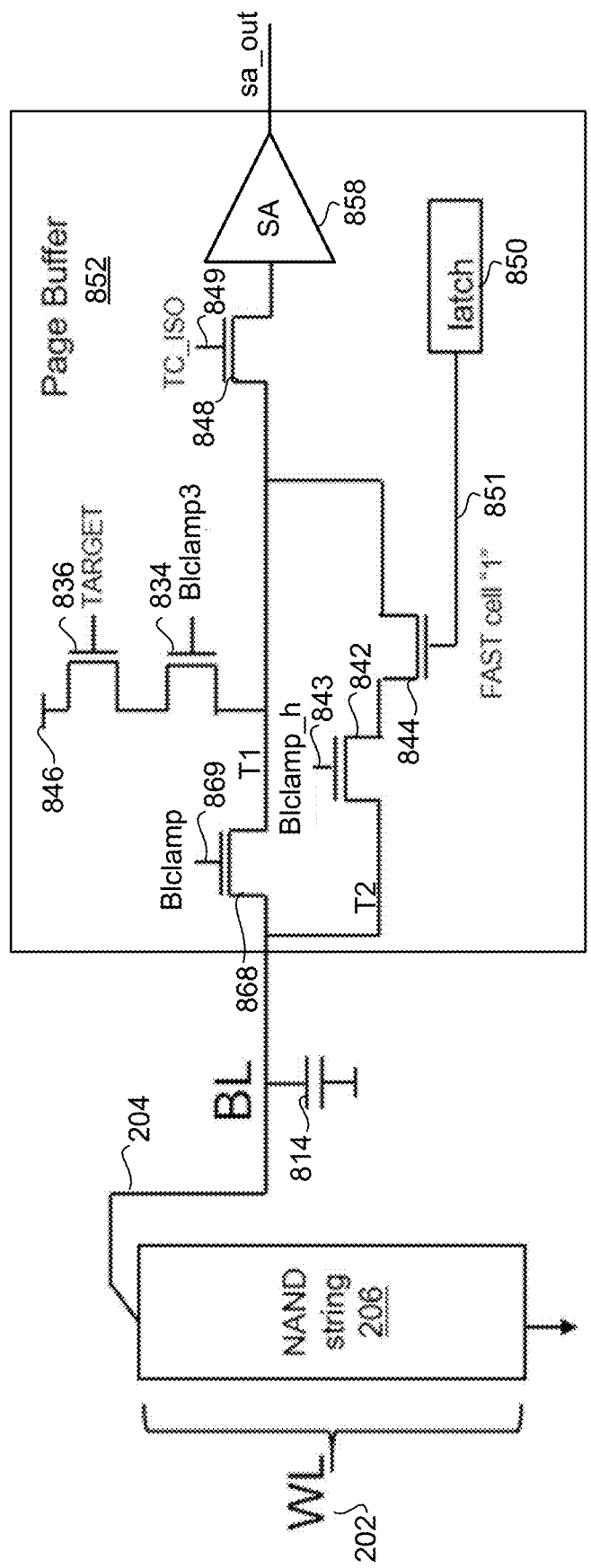
FIG. 8 is a schematic diagram of a page buffer configured to apply two different program verify voltage levels to a bit line during a program verify operation on two subsets of memory cells according to an embodiment.

FIG. 8 is a schematic diagram of a page buffer 852 configured to apply two different program verify voltage levels to a bit line during a program verify operation on two subsets of memory cells according to an embodiment. The two subsets of memory cells will be referred to as a first subset of memory cells and a second subset of memory cells located in the memory array 104 or 204A, of which the NAND string 206 is a part, merely for purposes of explanation. The page buffer 852 is coupled to a particular NAND string 206 by a particular bit line 204 (e.g., BL 204), such as illustrated in more detail in FIG. 2A. The select transistors 210 and 212, which selectively connect the NAND string 206 to the source 216 and bit line 204, respectively, are not shown in FIG. 8. While the discussion is directed to use of the page buffer 852 with the NAND string 206, other memory structures and architectures are suitable for use with the page buffer 852 where a current path can be selectively created from the bit line 204 to the source 216 dependent upon a data state of a memory cell selected for sensing. Further, the transistors are illustrated as n-channel metal oxide semiconductor (NMOS) transistors, to include nFETs, but in other embodiments, the transistors are p-channel metal oxide semiconductor (PMOS) transistors, to include a pFETs.

As part of a verify operation, the page buffer 852 can verify whether a program pulse successfully changed a threshold voltage of a target memory cell to indicate its desired data state. To do so, the page buffer 852 includes a first transistor path (T1) in which a first bit line (BL) clamp transistor 868 (Blclamp) is pre-charged at the gate, e.g., so that the gate of the first BL clamp transistor 868 is at a certain voltage, such as 1V only for purposes of explanation. The pre-charged voltage can be applied over a signal line 869 attached to the gate of the first BL clamp transistor 868. Once the first BL clamp transistor 868 is pre-charged (e.g., a gate of the first BL clamp transistor 868 and the signal line 869 are pre-charged), the bit line 204 is pre-charged to the pre-charged gate voltage less the threshold voltage (Vth) of the first BL clamp transistor 868. In the current example, this would be 1V less a Vth of 0.6V, meaning the bit line 204 is pre-charged to 0.4V. Thus, this 0.4V can be understood as a first voltage corresponding to a first PV voltage level.

In some embodiments, in order to supply a selectable source of a second PV voltage level, the page buffer 852 further includes a second transistor path (T2) that is coupled in parallel with the first transistor path. The second transistor path can include a second bit line (BL) clamp transistor 842 (Blclamp_h) that is pre-charged to a second gate voltage that is higher than a first gate voltage. For example, the second BL clamp transistor 842 of the second transistor path can be arranged in cascode condition with the first BL clamp transistor 868 of the first transistor path. For purposes of explanation, the gate of the second BL clamp transistor 842 (which can include a signal line 843) is pre-charged to 1.3V. The pre-charged voltage can be applied over the signal line 843 attached to the gate of the second BL clamp transistor 842. As a result of this pre-charging, a source of the second BL clamp transistor 842 (as well as the bit line 204 coupled to the source of the second BL clamp transistor 842) is also pre-charged to the gate voltage less the Vth of the second BL clamp transistor 842. In this example, this would be 1.3V less a Vth of 0.6V, meaning the source of the second BL clamp transistor 842 and the bit line 204 are pre-charged to 0.7V. Thus, this 0.7V can be understood as a second voltage corresponding to a second PV voltage level. In these embodiments, the second gate voltage is higher than the first gate voltage by a difference between the second voltage and the first voltage.

In various embodiments, the second transistor path (T2) further includes a trigger transistor 844 coupled in series with the second bit line (BL) clamp transistor 842, e.g., having a source coupled to a drain of the second BL clamp transistor 842. A drain of the trigger transistor 844 is coupled to the bit line 204 that runs through the first transistor path. In these embodiments, a latch is coupled to a gate of the trigger transistor 842. The latch 850 can store a value that indicates whether a memory cell to undergo a program verify operation is a fast or slow QCL cell compared to another memory cell. The control logic of the local media controller 135 can store this value in the latch 850. For example, in response to classifying the memory cell as a slow QCL cell, the control logic can store a logical zero ("0") in the latch 850. The latch 850 feeds the logical zero value to the gate of the trigger transistor 844, e.g., over a signal line 851, thus keeping the trigger transistor turned OFF, and the second transistor path inactive.

Further by way of example, in response to classifying the memory cell as a fast QCL cell, the control logic can store a logical one ("1") in the latch 850. The latch 850 feeds the logical one value to the gate of the trigger transistor 844, e.g., over the signal line 851, thus turning ON the trigger transistor 844. For example, the logical one value is sufficient to be greater than the threshold voltage of the trigger transistor 844. Simultaneously, the control logic can cause the first BL clamp transistor 868 to turn OFF, e.g., sending a voltage signal to the signal line 869 that causes the gate-source voltage to be less than Vth of the first BL clamp transistor 868. In this way, the second transistor path is activated while the first transistor path is deactivated.

In related embodiments, once one of the first transistor path or the second transistor path is activated, the control logic turns a transistor 848 (tc_iso) coupled to a sense amplifier 858 of the page buffer 852. The control logic, for example, can send a voltage signal to a signal line 849 attached to the gate of the transistor 848. In response to the transistor 848 turning ON, a current from the page buffer 852 can be stored in a capacitor 814 for a subsequent PV operation in which the sense amplifier 858 senses a voltage level of the threshold voltage distribution in the connected memory cell. The sa_out signal from the page buffer 852 can be sent back to the control logic (of the local media controller 135) for purposes of deciding whether a program pulse (e.g., a first program pulse) successfully changed a threshold voltage of a target memory cell to indicate its desired data state.

In various embodiments, the page buffer 852 also includes a third BL clamp transistor 834 (Blclamp3) and a target transistor 836 (TARGET) coupled between a voltage node 846 (e.g., a supply voltage Vcc) and the first transistor path, e.g., at the drain of the first BL clamp transistor 868. The third BL clamp transistor 834 and the target transistor 836 can also be pre-charged and provide current flow through the page buffer 852 when performing a program verify operation. The control logic, in some embodiments, sends a voltage signal to a gate of the target transistor 836 at a level for which an amount of desired current will be caused to flow through the third BL clamp transistor 834 and onto the bit line 204.

In some embodiments, the page buffer 852 could be similarly configured to apply more than two program verify voltages to compensate for more than two QCL rates or states, as previously mentioned. For example, these different QCL rates or states could cover a third subset of memory cells, e.g., that are classified with the "slowest" QCL. Thus, a third transistor path (or T3) can be a replicated version of the second transistor path (T2) and include a second latch from which to trigger ON the third transistor path.

Figure 9A:
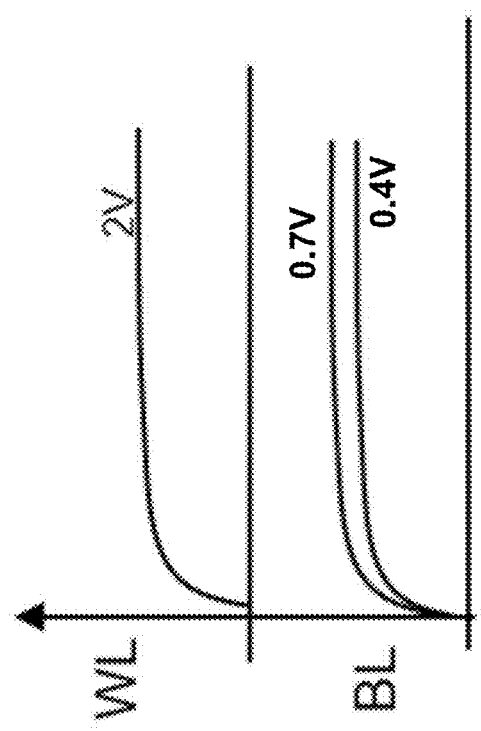
FIG. 9A is a graph illustrating two bit line voltage values, proposed for use in a dual verify operation, and a wordline voltage value useable in the dual verify operation according to an embodiment.

FIG. 9A is a graph illustrating two bit line voltage values, proposed for use in a dual verify operation, and a wordline voltage value useable in the dual verify operation according to an embodiment. Further to the example discussed with reference to FIG. 8, the first bit line voltage value is 0.4V applied by the first transistor path (T1) and employed for slow QCL cells and a second bit line voltage value is 0.7V applied by the second transistor path (T2) for fast QCL cells. As discussed previously, the fast QCL cells can be so classified based on having a higher threshold voltage distribution upon being programmed by a program pulse, e.g., a first program pulse, compared to a threshold voltage distribution of the slow QCL cells. The values of 0.4V and 0.7V, respectively, are but illustrations, as these separate bit line voltages (e.g., different program PV levels) can have other values, such as 1V and 0.7V, or 1.1V and 0.8V, respectively, or the like. Further, additional gaps in PV levels can be applied to subsequent programming of higher-level voltage distributions associated with higher-level logical states between two different memory cells, e.g., as would be expected in ISPP-based programming of multiple logical states.

Figure 9B:
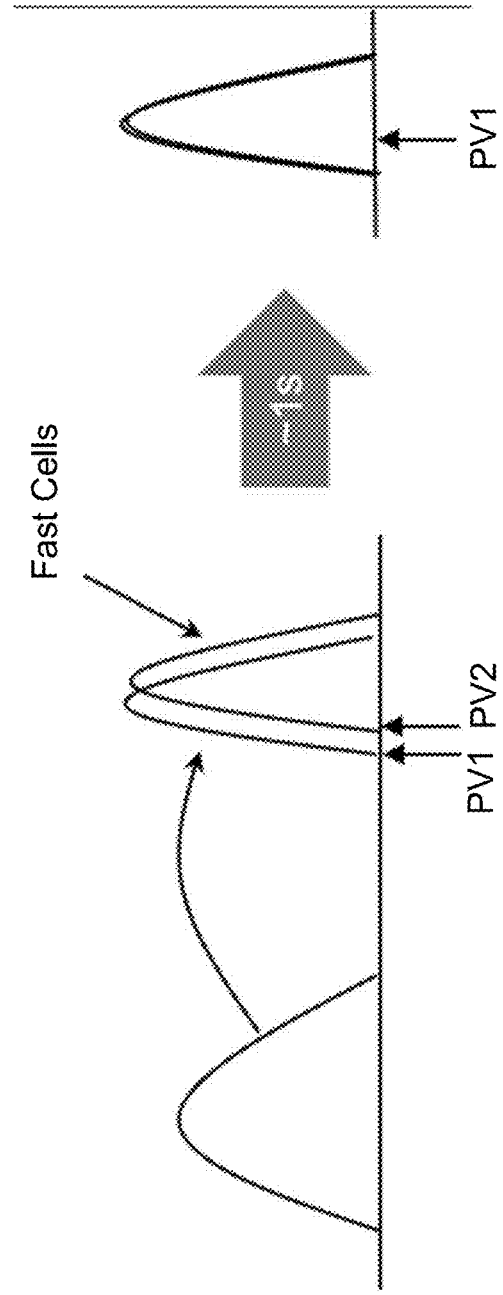
FIG. 9B is a graph of threshold voltage distributions as a result of applying the two bit line voltage values in performing a program verify operation on two subsets of memory cells and the natural compaction of the threshold voltage distributions about a second later according to an embodiment.

FIG. 9B is a graph of threshold voltage distributions as a result of applying the two bit line voltage values in performing a program verify operation on two subsets of memory cells and the natural compaction of the threshold voltage distributions about a second later according to an embodiment. As can be observed, the threshold voltage distribution of the slow QCL cells is programmed beyond a first program voltage level (PV1), which is 0.4V is FIG. 9A. In contrast, the threshold voltage distribution of the fast QCL cells is programmed beyond a higher program verify (PV) voltage, PV2, which is 0.7V in FIG. 9A. Although ISPP-based programming is performed at different PV voltage values, the two threshold voltage distributions of the two memory cells still compact onto to each other after about a second (or seconds), e.g., closer to the PV1 voltage level. This is due to the faster quicker charge loss of the fast QCL cell.

Figure 10:
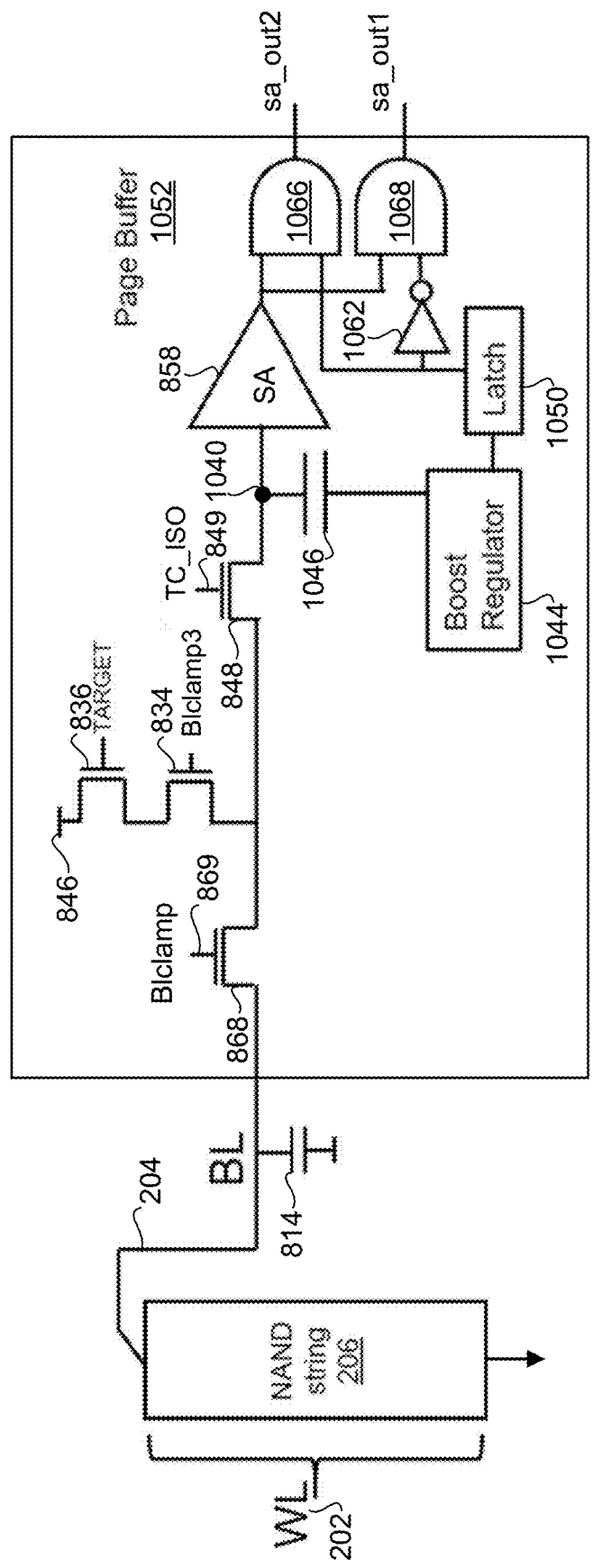
FIG. 10 is schematic diagram of a page buffer configured to apply two different program verify voltage levels to a bit line during a program verify operation on two subsets of memory cells according to another embodiment.

FIG. 10 is schematic diagram of a page buffer 1052 configured to apply two different program verify voltage levels to a bit line during a program verify operation on two subsets of memory cells according to another embodiment. The page buffer 1052 of FIG. 10 has some similarities as the page buffer 852 of FIG. 8, as has been similarly numbered. Instead of two transistor paths, however, the page buffer 1052 is configured to generate two different PV voltage levels with which to perform a program verify operation through boosting a sense node.

More specifically, in alternative embodiments, the page buffer 1052 includes a sense node 1040 coupled between the bit line 204 and the sense amplifier 858. For example, the sense node 1040 can be located between the transistor 848 and the sense amplifier 858 of the page buffer 1052. The page buffer 1052 further includes a boost regulator 1044 to capacitively boost the voltage of the sense node 1040 and thus change a voltage threshold of the sense amplifier 858 from the first voltage to the second voltage. Recall that the first voltage is a first program verify voltage value (discussed as 0.4V with reference to the page buffer 852 of FIG. 8) and the second voltage is a second program verify voltage level that is higher than the first program verify voltage value (discussed as 0.7V with reference to the page buffer 852 of FIG. 8). The boost regulator 1044, for example, can provide a small amount of current to charge a capacitor 1046 coupled between the sense node 1040 and the boost regulator 1044 to a difference between the first voltage and the second voltage, e.g., 0.3V.

In various embodiments, the page buffer 1052 includes a latch 1050 coupled to the boost regulator 1044. The latch 1050 can store a value that indicates whether a memory cell that undergoes a program verify operation is a fast or a slow QCL cell. The control logic of the local media controller 135 can store this value in the latch 1050. For example, in response to classifying the memory cell as a slow QCL cell, the control logic can store a logical zero ("0") in the latch 850. The logical zero value is a default input to the boost regulator 1044, which therefore takes no action and the page buffer 1052 performs a program verify operation at the lower PV voltage level.

Further by way of example, in response to classifying the memory cell as a fast QCL cell, the control logic can store a logical one ("1") in the latch 850. The latch 1050 feeds the logical one value to the boost regulator 1044, which is therefore triggered to boost the charge of the capacitor 1046 by an incremental increase in voltage, which when added to the first voltage, generates the second voltage that is provide a second PV voltage level. Thus, the logical value of one in the latch 850 can cause the boost regulator 1044 to change the voltage threshold of the sense amplifier 858. Because the sense amplifier 858 senses at a higher voltage, the PV verify level effectively changes when performing a program verify operation with the page buffer 1052.

In related embodiments, once the first BL clamp transistor 868 is pre-charged along with the third BL clamp transistor 834 and the target transistor 836 (as discussed with reference to FIG. 10), the control logic turns the transistor 848 (tc_iso) coupled to the sense amplifier 858 of the page buffer 1052. The control logic, for example, can send a voltage signal to a signal line 849 attached to the gate of the transistor 848. In response to the transistor 848 turning ON, a current from the page buffer 852 can be stored in the capacitor 814 for a subsequent PV operation in which the sense amplifier 858 senses a voltage level of the threshold voltage distribution in the connected memory cell. An output signal from the page buffer 852, as a result of the program verify operation, can be sent back to the control logic (of the local media controller 135) for purposes of deciding whether a program pulse (e.g., a first program pulse) successfully changed a threshold voltage of a target memory cell to indicate its desired data state.

Because boosting performed by the boost regulator 1044 can be performed quickly and the program verify operation to the sense amplifier 858 can also be performed quickly, the output of the page buffer 1052 can be strobed quickly to the control logic. For example, where it takes the page buffer perhaps on the order of 10 μs to measure a current level in the memory cell, it may only take about 1 μs to measure a voltage level of a threshold voltage distribution for purposes of a program verify operation. For this reason, the page buffer 1052 can optionally include additional circuitry to generate two different sense amplifier (SA) outputs for each of the two subsets of memory cells, e.g., one of which is a slow QCL cell and the other of which is a fast QCL cell if a program verify operation is performed on both within quick succession.

More specifically, in some embodiments, the page buffer 1052 includes a first AND gate 1066 to output sensed data from the first memory cell (e.g., a fast QCL cell) and receive inputs including outputs of the sense amplifier 858 and the latch 1050. In this way, when the latch 1050 stores a logical value of one, the PV voltage level is the higher second voltage and the first AND gate 1066 outputs a second SA output (sa_out2). The page buffer 1052 can further include an inverter 1062 that receives, as input, the output of the latch 1050. The page buffer 1052 can further include a second AND gate 1068 to output sensed data from the second memory cell, e.g., at a first SA output (sa_out1) and receive inputs that include outputs of the sense amplifier 858 and the inverter 1062. In this way, when the latch 1050 stores a zero value, the boost regulator is not activated and the inverter 1062 activates causes the second AND gate 1068 to output the first SA output (sa_out1). In these embodiments, each of sa_out1 and sa_out2 can be provided to the control logic to enable the control logic to know when each of the two different program verify levels have been met by any particular cell classified as slow QCL or fast QCL, respectively.

In some embodiments, the page buffer 1052 could be similarly configured to apply more than two program verify voltages to compensate for more than two QCL rates or states. For example, these different QCL rates or states could cover a third subset of memory cells, e.g., that are classified with the "slowest" QCL. For example, a second capacitor can be added in parallel with the capacitor f1046 that enables adding a second additional amount of voltage to the normal PV voltage level, thus generating a third voltage for performing PV using a third voltage. If this third voltage is for the slowest QCL cells, the capacitor can be used to deboost the PV voltage.

Figure 11:
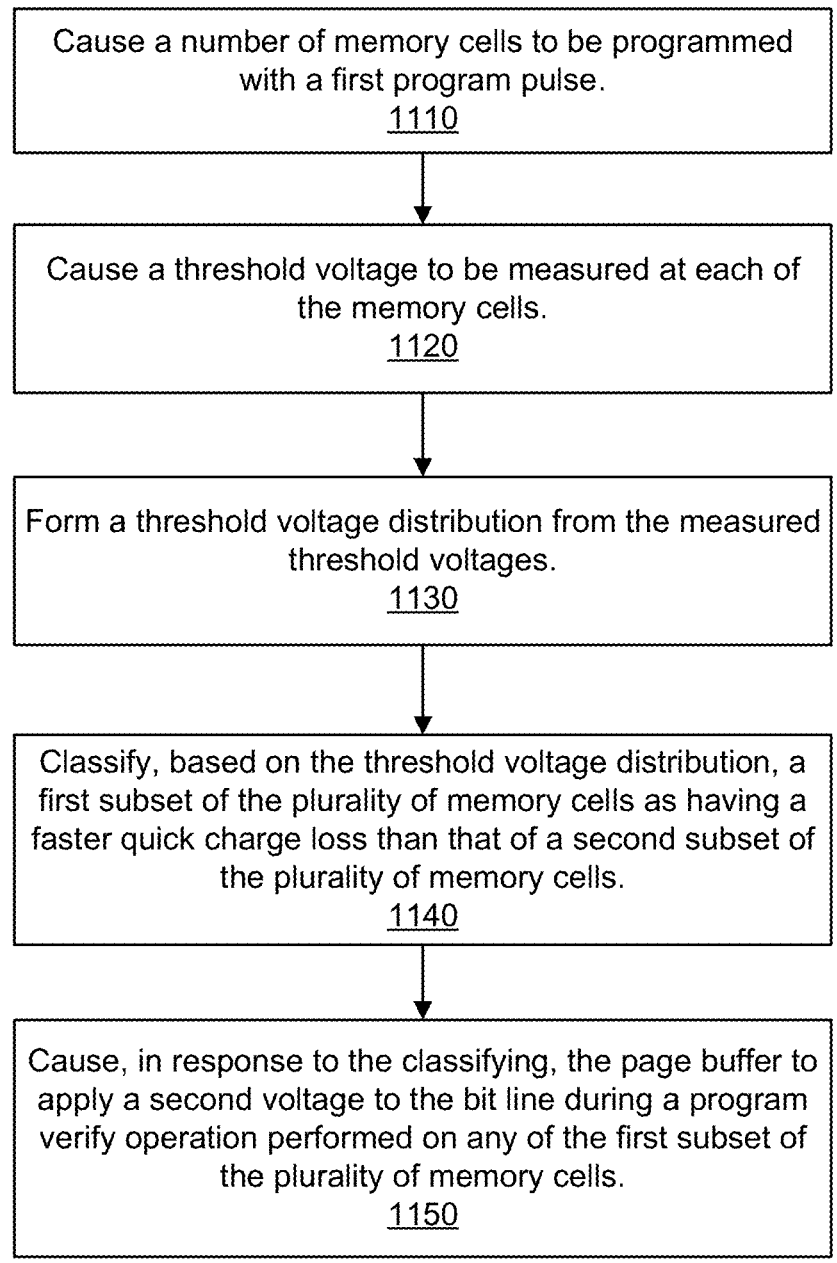
FIG. 11 is a flow diagram of an example method of employing disclosed page buffers to apply two different program verify voltage levels to a bit line during a program verify operation on two subsets of memory cells according to some embodiments.

FIG. 11 is a flow diagram of an example method 1100 of employing disclosed page buffers to apply two different program verify voltage levels to a bit line during a program verify operation on two memory cells according to some embodiments. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the local media controller 135 of FIGS. 1A-1B coupled to a page buffer (e.g., page buffer 152, page buffer 352, page buffer 852, or page buffer 1052). The page buffer is coupled to a bit line of a memory array having memory cells. The page buffer is to perform a program verify operation on the memory cells, one at a time, at one of a first voltage or a second voltage that is higher than the first voltage. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1110, a number of memory cells are programmed. For example, the processing logic causes a number of cells of a memory array to be programmed with a first program pulse.

At operation 1120, the memory cells are read. For example, the processing logic causes a threshold voltage to be measured at each of the memory cells.

At operation 1130, a threshold voltage distribution is formed. For example, the processing logic forms a threshold voltage distribution from the read threshold voltages.

At operation 1140, the memory cells are classified. For example, the processing logic classifies, based on the threshold voltage distribution, a first subset of the memory cells as having a faster quick charge loss than that of a second subset of the memory cells. The classifying can involve operations including measuring an upper tail location of the threshold voltage distribution above an upper threshold voltage value and identifying the first subset of the memory cells as memory cells having a threshold voltage above the upper threshold voltage value.

At operation 1150, a program verify operation is performed. For example, the processing logic causes, in response to the classifying, the page buffer to apply a second voltage to the bit line during a program verify operation performed on any of the first subset of the memory cells. The processing logic can further cause the page buffer to apply the first voltage to the bit line during a program verify performed on the first subset of the memory cells.

In the embodiment discussed with reference to FIG. 8, the processing logic can further store, in a latch coupled to a gate of a trigger transistor in response to the classifying, a logical value to cause the trigger transistor to turn on, the trigger transistor to activate a parallel transistor path that generates the second voltage for the program verify. In the embodiment discussed with reference to FIG. 10, the processing logic can further store, in a latch coupled to a boost regulator, a logical value to cause the boost regulator to increase a voltage threshold of a sense amplifier to perform the program verify at the second voltage. IN these ways, a second voltage can be employed by the page buffer in addition to the first voltage to perform a program verify at two different voltages.

Figure 12:
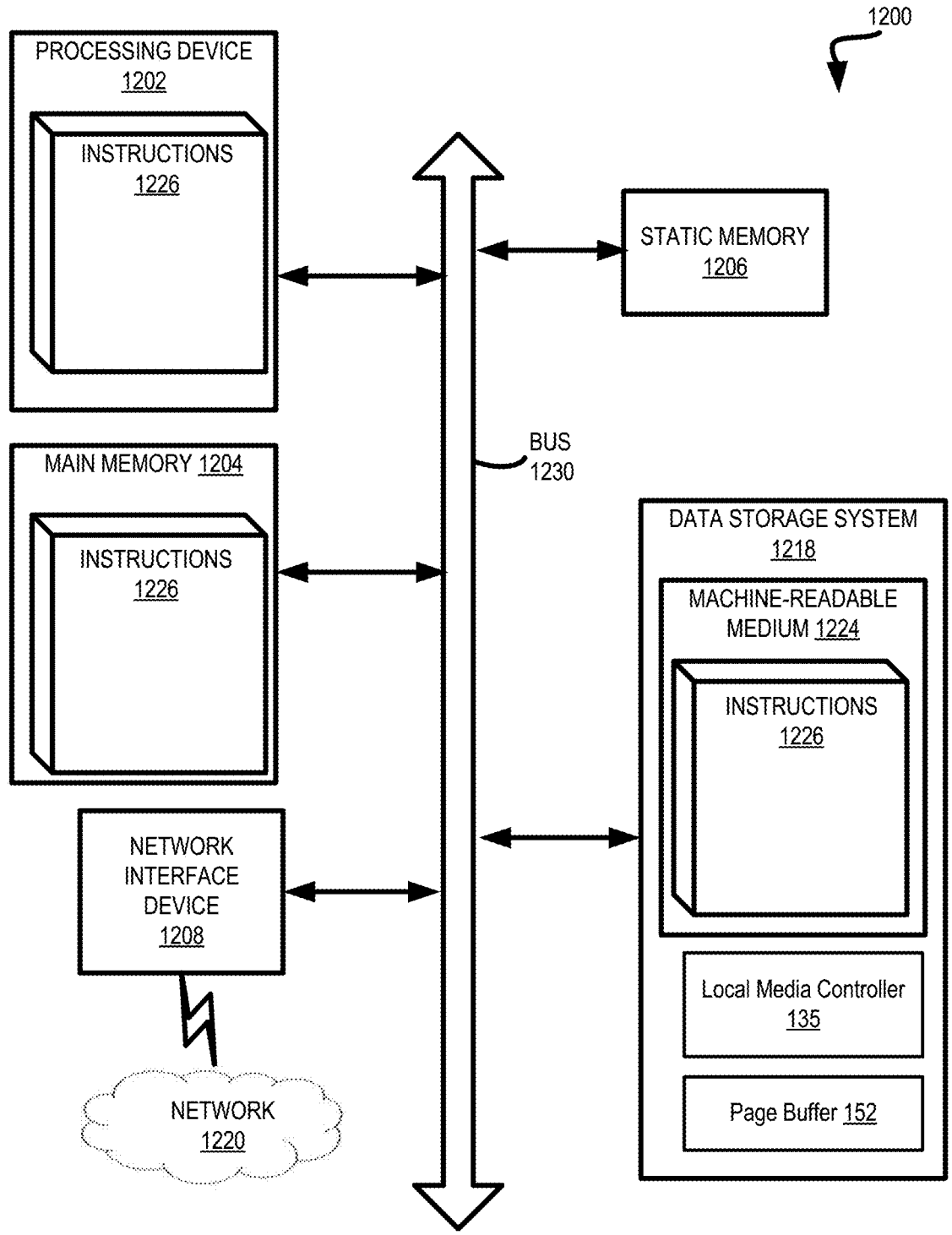
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1210 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1228 for performing the operations and steps discussed herein. The computer system 1200 can further include a network interface device 1212 to communicate over the network 1220.

The data storage system 1218 can include a machine-readable storage medium 1224 (also known as a computer-readable medium) on which is stored one or more sets of instructions 1228 or software embodying any one or more of the methodologies or functions described herein. The data storage system 1218 can further include the local media controller 135 and a page buffer 152 that were previously discussed. The instructions 1228 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1A.

In one embodiment, the instructions 1226 include instructions to implement functionality corresponding to a controller (e.g., the memory sub-system controller 115 of FIG. 1A). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising memory cells;
   a page buffer coupled to a bit line of the memory array, wherein the page buffer is to apply, to the bit line, one of a first voltage or a second voltage that is higher than the first voltage during a program verify operation performed on the memory cells; and
   control logic operatively coupled with the page buffer, the control logic to perform operations comprising:
   causing a plurality of the memory cells to be programmed with a first program pulse;
   measuring a threshold voltage for each of the plurality of the memory cells;
   forming a threshold voltage distribution for the plurality of the memory cells from the measured threshold voltages;
   comparing, using the threshold voltage distribution, a first quick charge loss of a first subset of the plurality of the memory cells to a second quick charge loss of a second subset of the plurality of the memory cells;
   determining, based on the comparing, that the first quick charge loss is faster than the second quick charge loss; and
   causing, in response to the determining, the page buffer to apply the second voltage to the bit line during the program verify operation performed on any of the first subset of the plurality of the memory cells until the first subset is programmed beyond the second voltage.

2. The memory device of claim 1, wherein the operations further comprise identifying the first subset of the plurality of the memory cells by:
   measuring an upper tail of the threshold voltage distribution above an upper threshold voltage value; and
   identifying the first subset of the plurality of the memory cells as memory cells having a threshold voltage above the upper threshold voltage value.

3. The memory device of claim 1, wherein the operations further comprise causing the page buffer to apply the first voltage to the bit line during the program verify operation performed on any of the second subset of the plurality of the memory cells.

4. The memory device of claim 3, wherein the operations further comprise identifying the second subset of the plurality of the memory cells by:
   measuring an upper tail of the threshold voltage distribution above an upper threshold voltage value; and
   identifying the second subset of the plurality of the memory cells as memory cells having a threshold voltage below or equal to the upper threshold voltage value.

5. The memory device of claim 1, wherein the page buffer comprises:
   a first transistor path comprising a first bit line (BL) clamp transistor that is pre-charged to a first gate voltage; and
   a second transistor path that is coupled in parallel with the first transistor path, the second transistor path comprising a second BL clamp transistor that is pre-charged to a second gate voltage that is higher than the first gate voltage by a difference between the second voltage and the first voltage.

6. The memory device of claim 5, wherein the second transistor path further comprises:
   a trigger transistor coupled in series with the second BL clamp transistor; and
   a latch coupled to a gate of the trigger transistor, wherein the operations further comprise storing a logical value in the latch in response to determining the first subset of the plurality of the memory cells as having a faster quick charge loss than that of the second subset of the plurality of the memory cells, the logical value to cause the trigger transistor to turn on.

7. The memory device of claim 1, wherein the page buffer comprises:
   a sense node coupled between the bit line and a sense amplifier;

a boost regulator to capacitively boost the voltage of the sense node and change a voltage threshold of the sense amplifier from the first voltage to the second voltage; and a latch coupled to the boost regulator, wherein the operations further comprise storing a logical value in the latch in response to determining the first subset of the plurality of the memory cells as having a faster quick charge loss than that of the second subset of the plurality of the memory cells, the logical value to cause the boost regulator to change the voltage threshold.

8. The memory device of claim 7, further comprising:
a first AND gate to output sensed data from each of the first subset of the plurality of the memory cells and receive inputs comprising outputs of the sense amplifier and the latch;

an inverter receiving an input comprising the output of the latch; and a second AND gate to output sensed data from each of the second subset of the plurality of the memory cells and receive inputs comprising outputs of the sense amplifier and the inverter.

9. A device comprising:
a page buffer coupled to a bit line of a memory array of memory cells, wherein the page buffer comprises:
  a first transistor path to apply a first voltage on the bit line during a first program verify operation on a first subset of a plurality of the memory cells of the memory array, wherein the first transistor path comprises a first bit line (BL) clamp transistor that is pre-charged to a first gate voltage; and
  a second transistor path that is coupled in parallel with the first transistor path, the second transistor path to apply a second voltage, which is higher than the first voltage, to the bit line during a second program verify operation on a second subset of the plurality of the memory cells, wherein the second transistor path comprises a second BL clamp transistor that is pre-charged to a second gate-source voltage that is higher than the first gate voltage by a difference between the second voltage and the first voltage; and
control logic operatively coupled with the page buffer, the control logic to perform operations comprising:
  causing the plurality of the memory cells to be programmed with a first program pulse;
  measuring a threshold voltage for each of the plurality of the memory cells;
  forming a threshold voltage distribution from the measured threshold voltages;
  classifying, based on the threshold voltage distribution, the second subset of the plurality of the memory cells as having a faster quick charge loss than that of the first subset of the plurality of the memory cells; and
  triggering on, in response to the classifying, the second transistor path to apply the second voltage to the bit line during the second program verify operation on the second subset of the plurality of the memory cells.

10. The device of claim 9, wherein the classifying comprises:
measuring an upper tail of the threshold voltage distribution above an upper threshold voltage value; and
identifying the second subset of the plurality of the memory cells as memory cells having a threshold voltage above the upper threshold voltage value.

11. The device of claim 9, wherein the operations further comprise causing the page buffer to apply the first voltage to the bit line via the first transistor path during the first program verify operation performed on the first subset of the plurality of the memory cells.

12. The device of claim 11, wherein the operations further comprise classifying the first subset of the plurality of the memory cells by:
measuring an upper tail of the threshold voltage distribution above an upper threshold voltage value; and
identifying the first subset of the plurality of the memory cells as memory cells having a threshold voltage below or equal to the upper threshold voltage value.

13. The device of claim 9, wherein the second transistor path further comprises:
a trigger transistor coupled in series with the second BL clamp transistor; and
a latch coupled to a gate of the trigger transistor, wherein the operations further comprise storing a logical value in the latch in response to classifying the second subset of the plurality of the memory cells as having a faster quick charge loss than that of the first subset of the plurality of the memory cells, the logical value to cause the trigger transistor to turn on.

14. A method of operating a device comprising a page buffer coupled to a bit line of a memory array of memory cells, the page buffer to apply one a first voltage or a second voltage that is higher than the first voltage during a program verify operation performed on the memory cells, and control logic coupled with the page buffer, wherein the method of operating the device comprises:
causing, by the control logic, a plurality of the memory cells to be programmed with a first program pulse;
causing, by the control logic, a threshold voltage to be measured at each of the plurality of the memory cells;
forming, by the control logic, a threshold voltage distribution for the plurality of the memory cells from the measured threshold voltages;
comparing, using the threshold voltage distribution, a first quick charge loss of a first subset of the plurality of the memory cells to a second quick charge loss of a second subset of the plurality of the memory cells;
determining, based on the comparing, that the first quick charge loss is faster than the second quick charge loss; and
causing, by the control logic, in response to the determining, the page buffer to apply the second voltage to the bit line during the program verify operation performed on any of the first subset of the plurality of the memory cells until the first subset is programmed beyond the second voltage.

15. The method of claim 14, further comprising identifying the first subset of the plurality of the memory cells by:
measuring an upper tail of the threshold voltage distribution above an upper threshold voltage value; and
identifying the first subset of the plurality of the memory cells as memory cells having a threshold voltage above the upper threshold voltage value.

16. The method of claim 14, further comprising causing the page buffer to apply the first voltage to the bit line during the program verify operation performed on the second subset of the plurality of the memory cells.

17. The method of claim 16, further comprising identifying the second subset of the plurality of the memory cells by:
measuring an upper tail of the threshold voltage distribution above an upper threshold voltage value; and identifying the second subset of the plurality of the memory cells as memory cells having a threshold voltage below the upper threshold voltage value.

18. The method of claim 14, further comprising storing, in a latch coupled to a gate of a trigger transistor in response to the determining, a logical value to cause the trigger transistor to turn on, the trigger transistor to activate a transistor path that is parallel to the trigger transistor and that generates the second voltage for the program verify operation.

19. The method of claim 14, further comprising storing, in a latch coupled to a boost regulator, a logical value to cause the boost regulator to increase a voltage threshold of a sense amplifier to perform the program verify operation at the second voltage.

* * * * *